United States Patent
Kuo et al.

(10) Patent No.: US 9,543,507 B2
(45) Date of Patent: Jan. 10, 2017

(54) SELECTOR FOR LOW VOLTAGE EMBEDDED MEMORY

(75) Inventors: Charles Kuo, Hillsboro, OR (US); Elijah V. Karpov, Santa Clara, CA (US); Brian S. Doyle, Portland, OR (US); David L. Kencke, Beaverton, OR (US); Robert S. Chau, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 337 days.

(21) Appl. No.: 13/997,392

(22) PCT Filed: Apr. 12, 2012

(86) PCT No.: PCT/US2012/033295
§ 371 (c)(1),
(2), (4) Date: Jun. 24, 2013

(87) PCT Pub. No.: WO2013/154564
PCT Pub. Date: Oct. 17, 2013

(65) Prior Publication Data
US 2014/0209892 A1 Jul. 31, 2014

(51) Int. Cl.
*H01L 43/10* (2006.01)
*G11C 8/10* (2006.01)
(Continued)

(52) U.S. Cl.
CPC ............ *H01L 43/10* (2013.01); *G11C 5/025* (2013.01); *G11C 5/063* (2013.01); *G11C 8/10* (2013.01);
(Continued)

(58) Field of Classification Search
USPC .................................. 365/148, 158
See application file for complete search history.

(56) References Cited

U.S. PATENT DOCUMENTS 7,135,696 B2   11/2006   Karpov et al.
7,280,390 B2   10/2007   Kostylev et al.
(Continued)

FOREIGN PATENT DOCUMENTS

WO   2013/033295 A1   3/2013

OTHER PUBLICATIONS

International Search Report and Written Opinion received for PCT Patent Application No. PCT/US2012/033295, mailed on Dec. 10, 2012, 11 Pages.
(Continued)

*Primary Examiner* — Daniel Whalen
(74) *Attorney, Agent, or Firm* — Finch & Maloney PLLC

(57) ABSTRACT

Techniques, materials, and circuitry are disclosed which enable low-voltage, embedded memory applications. In one example embodiment, an embedded memory is configured with a bitcell having a memory element and a selector element serially connected between an intersection of a wordline and bitline. The selector element can be implemented, for instance, with any number of crystalline materials that exhibit an S-shaped current-voltage (IV) curve, or that otherwise enables a snapback in the selector voltage after the threshold criteria is exceeded. The snapback of the selector is effectively exploited to accommodate the ON-state voltage of the selector under a given maximum supply voltage, wherein without the snapback, the ON-state voltage would exceed that maximum supply voltage. In some example embodiments, the maximum supply voltage is less than 1 volt (e.g., 0.9 volts or less).

21 Claims, 6 Drawing Sheets

(51) Int. Cl.
  *G11C 5/02* (2006.01)
  *G11C 5/06* (2006.01)
  *G11C 11/16* (2006.01)
  *G11C 13/00* (2006.01)
  *H01L 43/12* (2006.01)

(52) U.S. Cl.
  CPC ............ *G11C 11/16* (2013.01); *G11C 13/003* (2013.01); *H01L 43/12* (2013.01); *G11C 2213/15* (2013.01); *G11C 2213/71* (2013.01)

(56) References Cited

U.S. PATENT DOCUMENTS

| | | | |
|---|---|---|---|
| 7,515,460 B2 | 4/2009 | Gordon et al. | |
| 7,787,291 B2 | 8/2010 | Resta et al. | |
| 8,027,186 B2 | 9/2011 | Gutala et al. | |
| 2002/0181269 A1 | 12/2002 | Jeung et al. | |
| 2004/0113137 A1* | 6/2004 | Lowrey ............... | H01L 27/2481 257/5 |
| 2005/0122760 A1 | 6/2005 | Lee et al. | |
| 2009/0207645 A1 | 8/2009 | Parkinson | |
| 2009/0207717 A1 | 8/2009 | Van Kampen | |
| 2010/0110775 A1 | 5/2010 | Yoon et al. | |
| 2013/0044532 A1* | 2/2013 | Bethune et al. ............. | 365/148 |

OTHER PUBLICATIONS

Landingham, "Circuit Applications of Ovonic Switching Devices," IEEE Transactions on Electron Devices, vol. ED-20, No. 2, Feb. 1973, pp. 178-187.

Kimura, et al., "A Study of Multiple-Valued Magnetoresistive RAM (MRAM) Using Binary MTJ Devices," Multiple-Valued Logic, 2004. Proceedings. 34th International Symposium on, May 19-22, 2004, 6 pgs.

International Preliminary Report on Patentability received for PCT Patent Application No. PCT/US2012/033295, mailed on Oct. 23, 2014, 8 Pages.

* cited by examiner

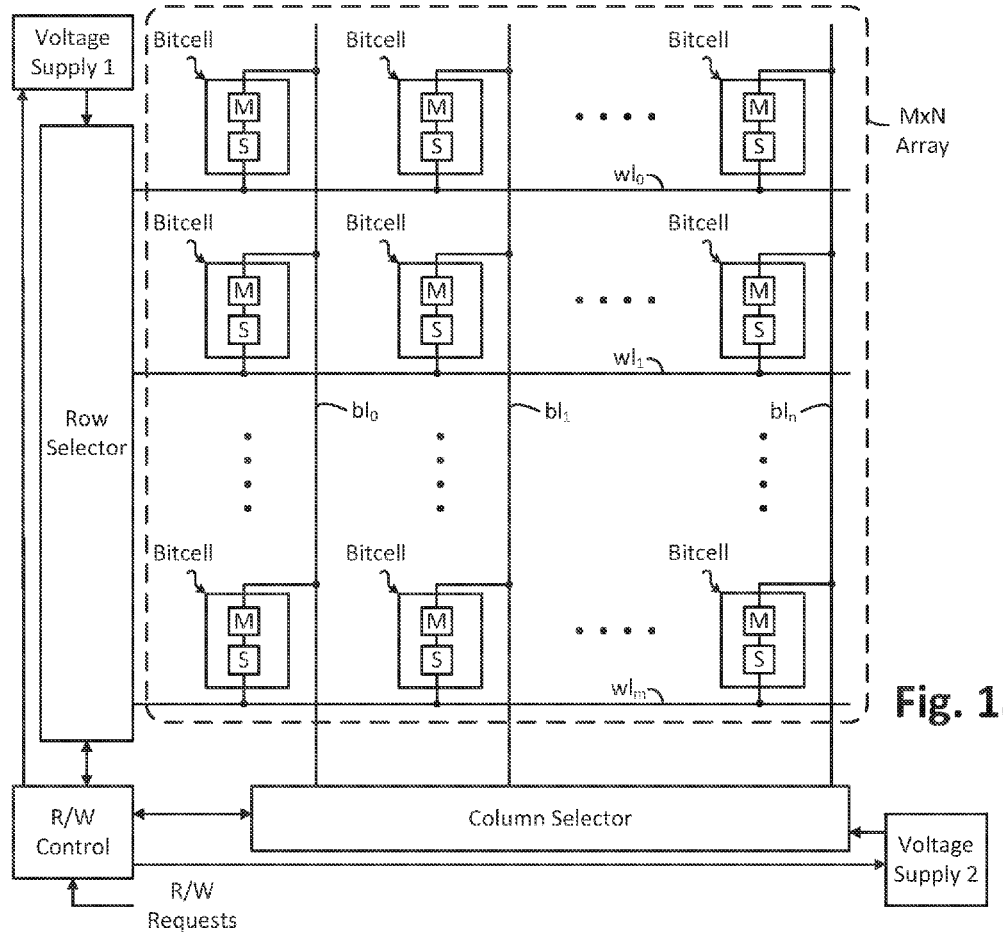
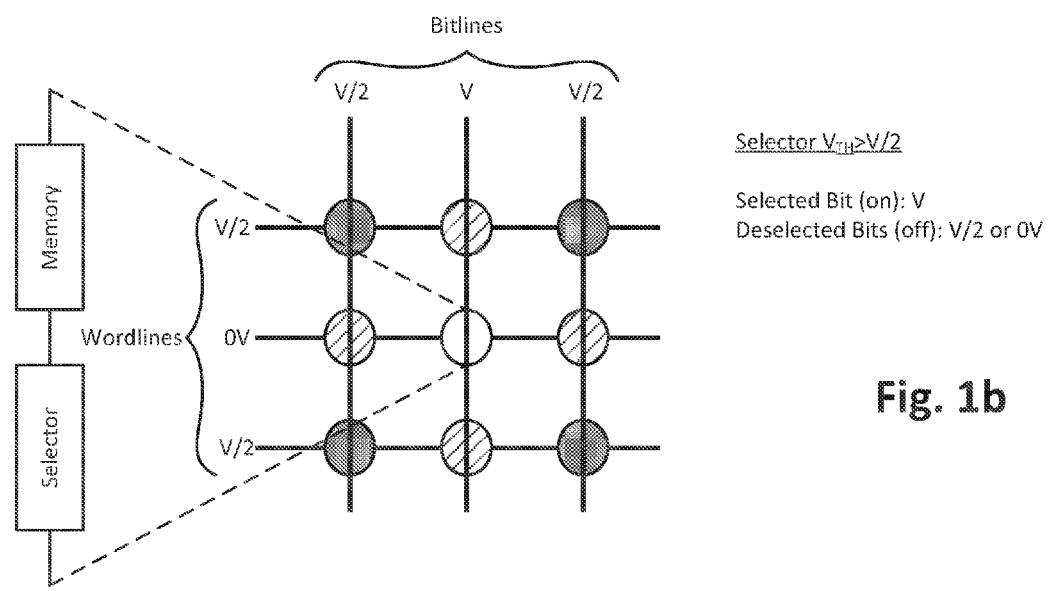
Fig. 1a
Fig. 1b

SELECTOR FOR LOW VOLTAGE EMBEDDED MEMORY

BACKGROUND

In general, embedded memory is an integrated on-chip memory which is distinct from stand-alone memory. Embedded memory is desirable because it eliminates the need for inter-chip communication between a processor and off-chip memory, and subsequently allows for high-speed data access and wide bus-width capability. Static random access memory (SRAM) and embedded dynamic random access memory (eDRAM) are typically used for embedded memory. There are a number of non-trivial issues associated with embedded memory, particularly given continued device scaling.

BRIEF DESCRIPTION OF THE DRAWINGS

FIG. 1a illustrates an example embedded bidirectional memory circuit configured in accordance with an embodiment of the present invention, and FIG. 1b illustrates an example V/2-biasing scheme that can be employed by the circuit of FIG. 1a, in accordance with an embodiment of the present invention.

Figure 2:
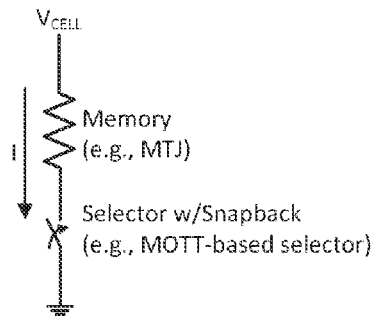
FIG. 2 illustrates an example bidirectional memory cell configured in accordance with an embodiment of the present invention.

As will be appreciated, the figures are not necessarily drawn to scale or intended to limit the claimed invention to the specific configurations shown. For instance, while some figures generally indicate straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques, materials, and circuitry are disclosed which enable low-voltage, embedded memory applications. In one example embodiment, an embedded memory is configured with a bitcell having a memory element and a selector element serially connected between an intersection of a wordline and bitline. The selector element can be implemented, for instance, with any number of crystalline materials that exhibit an S-shaped current-voltage (IV) curve, or that otherwise enables a snapback in the selector voltage after the threshold criteria is exceeded. In some embodiments, the snapback of the selector material is effectively exploited to accommodate the ON-state voltage of the selector under a given maximum supply voltage, wherein without the snapback, the ON-state voltage would exceed that maximum supply voltage. In some specific such cases, the maximum supply voltage is less than 1 volt (e.g., 0.9 volts or less).

General Overview

As previously indicated, there are a number of non-trivial issues associated with embedded memory. For instance, thin film selectors have been proposed for use with a resistive memory. The selector ensures that only the selected hit of the memory array is accessed during read and write operations. Many resistive memories use bidirectional switching, and therefore employ a V/2-inhibit scheme. Such V/2 memory cell biasing schemes ensure that the only the selected bitcell is ON and sees the maximum supply voltage, and the deselected bits are OFF by ensuring that the electrical bias across the bit is less than the selector threshold voltage ($V_{TH}$).

This selection criteria presents a difference between standalone and embedded memories. For standalone applications, the write voltage associated with the memory can easily exceed 1 volt. Examples include phase change memories (PCM) and resistive random access memories (RRAM). The minimum selector $V_{TH}$ is defined as: $V_{TH} > (V_{TH} + V_{MEMORY})/2$ which can be simplified to: $V_{TH} > V_{MEMORY}$. This means that the total voltage drop across the selector and memory elements of a given bitcell can be 2 volts or more. Thus, the maximum power supply cannot be less than 2 volts. There are some memories with write voltages of less than 1V. For instance, magnetic tunnel junctions (MTJ) devices can be written at around 0.6 volts. Using the rule derived above, however, the voltage drop across the selector and memory elements of the bitcell will be about 1.2 volts or more. However, such a write voltage still exceeds, for instance, a maximum power supply of 0.9 volts, which is the maximum supply voltage for, for instance, complementary metal oxide semiconductor (CMOS) embedded logic applications (e.g., $V_{CC} \leq 0.9$ volts).

Thus, and in accordance with an embodiment of the present invention, to achieve the voltage headroom required for low-voltage memory, an additional feature is required. In particular, one such embodiment of the present invention employs a selector element that effectively introduces a snapback in the selector voltage after the threshold criteria $V_{TH}$ is exceeded (or said differently, where the current through the bitcell exceeds the threshold current, $I > I_{TH}$). As a result, the selector is able to conduct more current at less supply voltage. This reduction in supply voltage accommodates the write voltage of a low voltage embedded memory.

Example Memory Circuit

FIG. 1a illustrates an example embedded bidirectional memory circuit configured in accordance with an embodiment of the present invention, and FIG. 1b illustrates an example V/2-biasing scheme that can be employed by the memory circuit of FIG. 1a, in accordance with an embodiment of the present invention. As can be seen, the memory circuit of this example embodiment includes column select circuitry, row select circuitry, read/write (R/W) control circuitry, voltage supply circuitry (Voltage Supply 1 and 2), and an M×N array of bitcells (M and N can be any integer values, as will be appreciated).

Each bitcell includes a bidirectional memory element and a selector connected in series, and the array is configured as a bidirectional cross point array. The actual array size will depend on the given application. Specific examples include a 32-row by 32-column organization, a 64-row by 64-column organization, 128-row by 128-column organization, or a 32-row by 128-column organization. Further note that the number of rows M need not match the number of columns N. As can be further seen, each column is associated with its own bitline (bl0, bl1, . . . , bln), and each bitline is driven by a corresponding column select circuit included in the column select circuitry. In addition, each row is associated with its own wordline (wl0, wl1, . . . , wlm), and each wordline is driven by a corresponding row select circuit included in the row select circuitry.

In operation, the R/W control circuitry receives memory access requests (e.g., from a local processor or communication chip in which the memory is embedded), generates the requisite control signals based on that request (e.g., read, write 0, or write 1), and applies those control signals to the row and column selector circuitry. In addition, the voltage supplies 1 and 2 are switched or otherwise commanded (e.g., by the R/W control and/or the respective selector circuitries) to provide the voltage necessary to bias the array so as to facilitate the requested action. The row and column selector circuitry then applies the appropriate voltages from voltage supplies 1 and 2 across the array so that only the selected bitcell or bitcells are accessed. As will be appreciated in light of this disclosure, each of the voltage supply 1, voltage supply 2, row selector circuitry, column select circuitry, and R/W control can be implemented with conventional or custom technology as desired, and the claimed invention is not intended to be limited to any particular configurations thereof. Rather, any suitable configurations can be used in an embodiment of the present invention where the selector of a given bitcell is configured with a threshold voltage $V_{TH}$, an ON-state voltage, and snapback to accommodate the ON-state voltage, wherein without snapback, the ON-state voltage could not be accommodated because the ON-state voltage without snapback would exceed the maximum supply voltage that can be provided by voltage supplies 1 and 2 in response to, for instance, a write access request. In one such example embodiment, the maximum supply voltage that can be provided by voltage supplies 1 and 2 for a write operation is less than 1 volt.

As will be appreciated, the memory is bidirectional in nature, in that the current flow through a given cell will depend on the voltage values applied by supplies 1 and 2. In general, the current will flow from the greater supply to the lower supply. For example, and in accordance with one example embodiment, if voltage supply 1 is 0.9 volts and voltage supply 2 is 0.0 volts, then current will flow from supply 1 through the corresponding row selector circuitry and corresponding bitcell, and through the corresponding column selector circuitry, to supply 2, assuming the selector of the corresponding bitcell is turned on (i.e., is $V_{TH}$ exceeded) so as to allow current to flow therethrough. The opposite current direction would apply if voltage supply 2 was 0.9 volts and voltage supply 1 was 0.0 volts. As will be further appreciated, the voltage supplies 1 and 2 can be configured to provide positive and negative voltage and/or current to the selected bitcells within the array, and may include components that are directed toward specific memory operations. For example, a supply may include specific current sources, set at different levels, for reading from and writing to memory cells. As previously noted, the row and column selector circuits operate to select among the different polarities of supply provided by the respective voltage supplies 1 and 2, which in this example embodiment are controlled by the R/W control circuitry. In still other embodiments, note that the memory may be unidirectional, in that bidirectionality is not required.

The example V/2-biasing scheme shown in FIG. 1*b* further illustrates how the voltage supplies 1 and 2 can be configured and applied so as to effectively select and deselect the various bitcells of the array. As can be seen, each bitcell is represented as a circle over the intersection of a given bitline and wordline. In this example memory access scenario, voltage supply 1 provides the deselected wordlines with V/2 and the selected wordline with 0 volts. In addition, voltage supply 2 provides the deselected bitlines with V/2 and the selected bitline with V. In one such example embodiment, assume that V equals 0.9 volts, and that V/2 therefore equals about 0.45 volts. Further assume that the selector threshold voltage $V_{TH}$ is greater than V/2 and less than V, such that in this specific example, $V_{TH}$ is greater than 0.45 volts but less than 0.9 volts. Thus, the only bitcell that will be turned on is the one in the center of the grid (and indicated with an unshaded circle). The selector of this bitcell will be biased with about 0.9 volts across it, and therefore will turn on (and where current will flow from the bitline voltage supply to the wordline voltage supply. The voltage drop across each of the other bitcells of the array will either be about 0 volts (indicated with darker shading) or about 0.45 volts (indicated with lighter shading), neither of which is sufficient to bias the respective selectors to conduct or otherwise turn on.

Thus, and in accordance with an embodiment of the present invention, during any given access operation (a read operation, a write 0 operation, or a write 1 operation), the row and column selector circuits typically select voltage supplies of opposite polarities, which defines the current flow direction. So, during, a write 1 operation column selector circuit may select, for instance, a positive supply while the row selector circuit selects a ground or negative or otherwise sufficiently smaller supply in order to pass current through a memory cell in a direction appropriate for writing a logic 1 to a selected memory cell. During a write 0 operation, the column selector circuit may then select a ground or negative supply while row selector circuit selects a positive supply or otherwise sufficiently larger supply, thereby providing for current flow through a selected memory cell in a direction opposite that required for a write 1 operation. The row and column selector circuits base their selections on input signals from the R/W control circuit, which may include, for instance: address, read, write 0 and write 1 signals. As will be appreciated, the selector circuits may include any suitable bidirectional switching architecture (conventional or custom) that can be used to select row and column lines (wordlines and bitlines) so as to facilitate selection of individual memory cells within the array, such as shown in FIG. 1*b*.

Selector with Snapback

FIG. 2 illustrates an example memory cell configured in accordance with an embodiment of the present invention. As can be seen, the memory cell (or bitcell) is implemented with a resistive memory element, which in one specific embodiment is a magnetic tunnel junction (MTJ) device, and a selector with snapback. The maximum voltage drop across the cell in this example is $V_{CELL}$ (i.e., $V_{CELL}$–0.0 volts=$V_{CELL}$), so as to provide a current flow (I) in the direction shown.

Figure 3A:
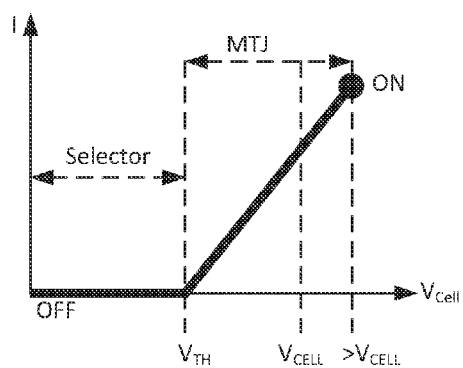
FIG. 3a illustrates an example selector performance without snapback.
Figure 3B:
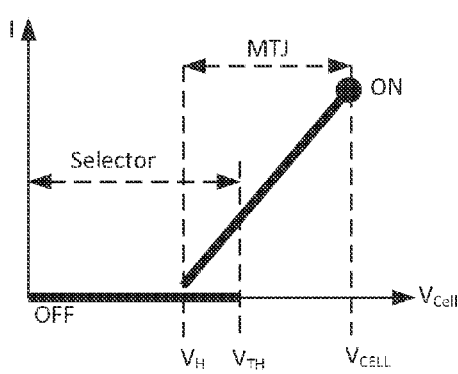
FIGS. 3b-3c illustrate an example selector performance with snapback in accordance with an embodiment of the present invention.

FIG. 3a illustrates selector performance without snapback, and FIG. 3b illustrates an example selector performance with snapback in accordance with an embodiment of the present invention. This particular example of FIG. 3b shows how an MTJ write can be accommodated with a selector that features snapback with an S-shaped IV curve. As can be seen in FIG. 3a, once the voltage across a bitcell exceeds the threshold $V_{TH}$, the selector without snapback transitions the bitcell from an OFF-state to an ON-state. However, note that the I-V curve associated with the selector indicates that the selector and memory write voltage cannot be accommodated at the given voltage supply $V_{CELL}$ (because the 'ON' voltage of the selector exceeds $V_{CELL}$).

Figure 3C:
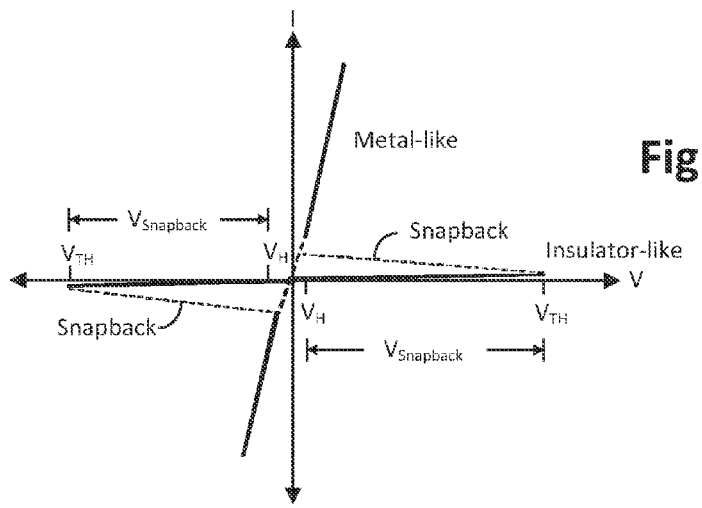

In contrast, and with reference to FIG. 3b, once the voltage across a bitcell exceeds the threshold $V_{TH}$, the selector with snapback transitions the bitcell from an OFF-state to an ON-state by changing from an insulator-like material to a metal-like conductive material, and as a result, snaps back to a hold voltage $V_H$ thereby accommodating the same memory under the same $V_{CELL}$ requirement. In this sense, the selector supports an S-shaped IV characteristic as generally shown in FIG. 3c. The selector is configured such that the selector turns off once the voltage across the bitcell falls below the hold voltage $V_H$ (or hold current, $I_H$). The snapback voltage $V_{Snapback}$ equals the threshold voltage $V_{TH}$ minus the hold voltage $V_H$. Said differently, the snapback voltage $V_{Snapback}$ is the voltage drop across the selector in the ON-state. The snapback of the selector is exploited to accommodate the ON-state voltage of the selector under the given maximum supply voltage $V_{CELL}$, wherein without the snapback, the ON-state voltage would exceed that maximum supply voltage. In some example embodiments, the maximum supply voltage $V_{CELL}$ can be less than 1 volt (e.g., 0.9 volts or less).

Thus, a selector configured in accordance with an embodiment of the present invention not only turns ON when $V_{TH}$ is exceeded and OFF when $V_H$ is no longer satisfied, but also can provides a snapback response. In accordance with some embodiments of the present invention, a selector generally includes an insulator material sandwiched between to electrode materials. The electrodes can be implemented with any number of suitable materials, such as but not limited to carbon, gold, nickel, platinum, silver, molybdenum, molybdenum nitride, molybdenum carbide, titanium, titanium nitride, titanium carbide, tungsten, tungsten carbide, tungsten nitride, and mixtures thereof, as well as conductive metal oxides.

In accordance with some embodiments of the present invention, example crystalline materials that enable a selector with an S-shaped IV characteristic or otherwise exhibit a snapback condition generally include, but are not limited to, multi-component oxide and alloy systems that contain metals from periods 4, 5, or 6 of the periodic table, and generally have partially filled valence d-shells. Ideally, such materials behave as an insulator (e.g., with only negligible leakage currents) in the OFF-state when biased below $V_{TH}$, and act as a metal (e.g., which conducts high currents) at relatively low biases when switched to the ON-state. The transition is reversible: when the bias is removed or otherwise no longer satisfied, the material returns to its original insulating state. In some specific example embodiments, the selector insulator is implemented with vanadium oxide ($VO_2$), manganese oxide (MnO), or titanium oxide ($Ti_2O_3$). Other so-called MOTT insulators having S-shaped IV curves with snapback may be used as well for the selector insulator, such as iron oxide ($Fe_2O_3$), niobium oxide ($NbO_2$), and tantalum oxide ($TaO_2$). In some embodiments, a mixture of such oxides can be used. In other embodiments, the insulator of the selector element can be implemented with oxides referred to as Perovskites having the chemical formula $R_{(1-x)}A_xBO_3$, where R is a rare-earth atom, A is a bivalent atom, and B may be selected from manganese, nickel, cobalt, titanium, or vanadium. In some embodiments, a mixture of such Perovskites can be used. In still other embodiments, the insulator of the selector element can be implemented with crystalline sulfides such as chromium sulphide (CrS) and iron sulphide (FeS), or a combination of such sulphides. In still other embodiments, the insulator of the selector element can be implemented with a combination of such crystalline oxides, Perovskites, and/or sulphides. Numerous variations will be apparent. Note that such crystalline materials with S-shaped IV characteristic are distinct from ovonic threshold switching chalcogenide materials with S-shaped IV characteristic which are amorphous. Each of these example materials generally exhibits a bidirectional S-shaped I-V characteristic or otherwise allow for a snapback condition as previously discussed with reference to FIGS. 3a-c, and can be used to implement the insulator layer of a selector element in accordance with an embodiment of the present invention.

Figure 4A:
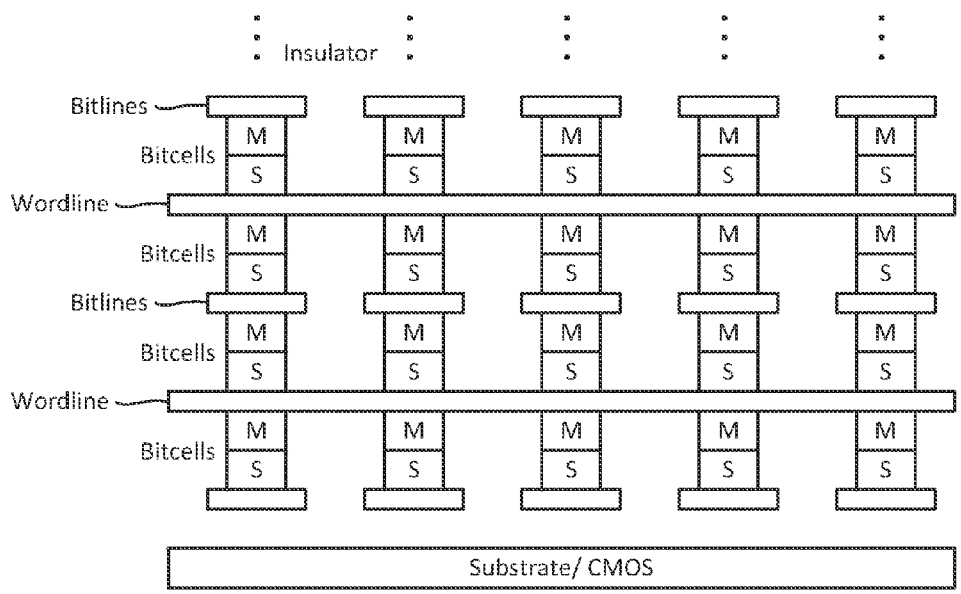
FIG. 4a illustrates a cross-section side view of an embedded bidirectional memory architecture configured in accordance with an embodiment of the present invention.

With such electrical characteristic and material systems in hand, the selector can be achieved with thin films in the backend semiconductor process, in accordance with some embodiments of the present invention. Building the embedded memory in the backend means that a dense cross point array cell can be achieved, example embodiments of which will be discussed in turn. For instance, a backend selector process enables the option of having multiple layers of selector plus memory elements on top of the logic periphery as shown in FIG. 4a.

Memory Element

As previously indicated, the memory element of the bitcells can be implemented with any number of memory technologies, whether bidirectional unidirectional. In one example embodiment, each of the bitcell memory elements is implemented with an MTJ, which is one specific memory technology that can be used in low voltage applications. An MTJ device is a magnetoresistive device whose resistance is programmable and can be set to either a high resistivity or low resistivity state in response to an applied magnetic field. The difference in resistance between these two states is generally referred to as the magnetoresistance (MR) ratio, which can range for instance from less than 10% to several hundred percent or more, depending on the temperature and materials from which the device is made.

A typical MTJ device configuration includes an insulator layer of tunneling oxide sandwiched between two ferromagnetic layers respectively referred to as the fixed and free layers. The direction of the magnetic field in the free layer determines whether the MTJ device is in the high resistivity state or in the low resistivity state. A binary zero can be stored in the MTJ device by changing its resistance to the low resistivity state, and a binary one can be stored by changing its resistance to the high resistivity state. Advantageously, no static power is required to maintain the resistance state once set. If the insulator layer is sufficiently thin, electrons may pass from one ferromagnetic layer to the other via quantum tunneling through the insulator layer.

The two ferromagnetic layers of a given MTJ typically exhibit magnetic anisotropy—a directional dependence of their magnetic properties. The magnetic anisotropy of a given ferromagnetic layer may result from various sources including, but not limited to: bulk-based anisotropy (e.g., magnetocrystalline anisotropy; shape anisotropy); and/or interface-based anisotropy. Depending upon the direction of magnetization of its constituent ferromagnetic layers, a given MTJ may be classified as exhibiting either: in-plane magnetic anisotropy; or out-of-plane magnetic anisotropy. An in-plane MTJ is one in which the direction of magnetization is along the plane of the two ferromagnetic layers. Conversely, an out-of-plane (perpendicular) MTJ is one in which the direction of magnetization is orthogonal to the plane of the constituent ferromagnetic layers. In either case, the two ferromagnetic layers may be configured such that their respective magnetizations are aligned either in the same direction—the parallel (P) state—or in opposing directions—the anti-parallel (AP) state. As will be appreciated in light of this disclosure, perpendicular MTJs are particularly useful in stacked memory configurations, in accordance with one embodiment of the present invention.

Additional details regarding MTJ devices that can be used as a memory element in accordance with an example embodiment of the present invention will be discussed with reference to FIGS. 5a-6d.

Multilayer Embedded Memory

FIG. 4a illustrates a cross-section side view of an embedded bidirectional memory architecture configured in accordance with an embodiment of the present invention. As can be seen, the structure comprises a stacked configuration that includes multiple selector-memory layers (four distinct layers shown in this example) formed on top of CMOS circuitry which may include, for instance, typical logic periphery (e.g., row and column selector circuits, readout circuits, etc). As can be further seen, a plurality of bitcells is provided, each having a selector element (S) and a memory element (M) connected in serial fashion between the intersection of a bitline and wordline. A dielectric or insulator material can be provided between the wordlines and bitlines and around the memory cells, so as to provide, for instance, desired isolation and structural integrity.

A number of benefits of such a memory structure will be apparent in light of this disclosure. For instance, in some such embodiments, the minimum cell size can be defined by the overlap of two metal lines, where the metal pitch can be defined as 2F (cell length or width from top-down or plan view). The potential reduction of a cross point array configured in accordance with one such example embodiment relative to, for instance, a conventional 1T+1R memory cell can be significant. For instance, the memory cell size in the example of FIG. 4a can generally be defined as about 2F by 2F, or 4F$^2$, while a corresponding 1T+1R memory cell would be about 4F by 4F, or 16F$^2$. In a more general sense, eDRAM is about 3× smaller than SRAM cell, and an array cell with selector as described herein can be, for instance, 4× smaller than eDRAM, or smaller.

Figure 4B:
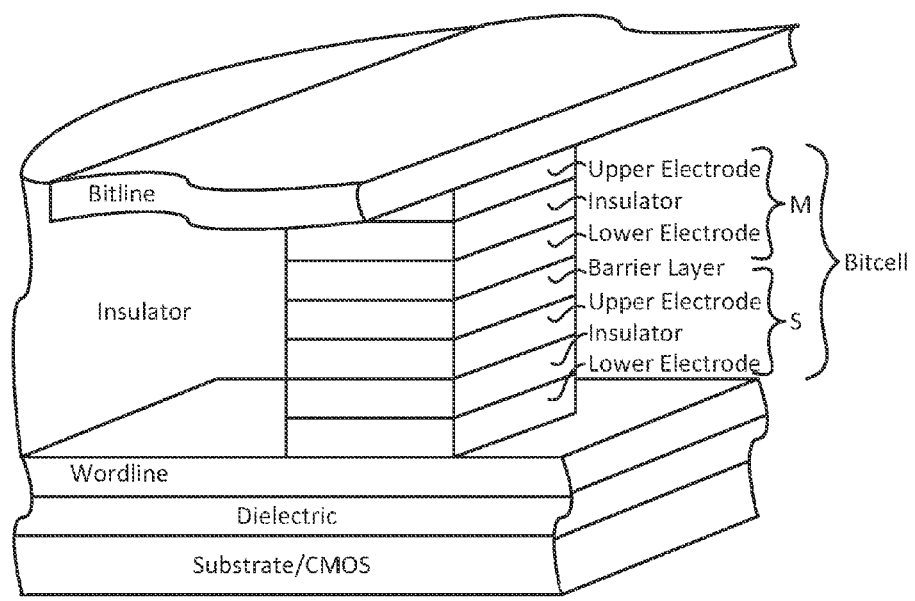
FIG. 4b illustrates a partial perspective view of the embedded bidirectional memory architecture shown in FIG. 4a, configured in accordance with an embodiment of the present invention.

FIG. 4b illustrates a partial perspective view of the embedded bidirectional memory architecture shown in FIG. 4a, configured in accordance with an embodiment of the present invention. As can be seen, the example bitcell configuration includes a memory element M having an insulator sandwiched between upper and lower electrodes, and a selector element S having an insulator sandwiched between upper and lower electrodes. In addition, this embodiment employs a barrier layer between the lower electrode of the memory element M and the upper electrode of the selector element S. Such a barrier layer can be used to inhibit inter-diffusion of elements. If diffusion is not a concern, note that no barrier layer is needed and the two electrodes can touch. In some specific cases, if inter-diffusion of elements is a concern, then the barriers layer can be, for example, an electrode between the selector and memory element electrodes, and implemented, for instance, with carbon, which is conductive but can act as an inert diffusion barrier as well. Any number of other such optional conductive barrier layer materials can also be used, as will be apparent in light of this disclosure.

With further reference to the example embodiment shown in FIG. 4b, the bitcell is formed over a substrate with a conductive wordline coupled to the lower electrode of the selector element S. As can be seen, an insulator (e.g., interlayer dielectric such as silicon dioxide or silicon nitride) can be used to separate the integrated circuit components formed in or on the underlying substrate from the bidirectional memory array. The components, which are implemented with CMOS technology in this example embodiment, may include any of a variety of components, such as logic gates, a microprocessor, communication chip, and/or memory, for example.

As previously explained, the electrodes of the selector element S can be implemented with any number of suitable electrode materials, such as carbon, gold, nickel, platinum, silver, molybdenum, molybdenum nitride, molybdenum carbide, titanium, titanium nitride, titanium carbide, tungsten, tungsten carbide, tungsten nitride, and mixtures thereof, as well as conductive metal oxides. The insulator layer of the selector S can be implemented with any suitable material that enables an S-shaped IV curve or otherwise allows for a snapback condition as previously described, and may include any of the previously indicated materials (e.g., crystalline insulators with snapback). Various other suitable electrode materials and insulator materials capable of providing a snapback condition will be apparent in light of this disclosure. As will be further appreciated, the electrodes need not be the same material and may include materials that provide or otherwise exhibit supplemental benefits such as diffusion barrier and heat sink capability.

The selector element S may switch from its conductive metal-like state to its insulator-like state, and vice versa, depending on the biasing applied across the bitcell. Note that in some cases, however, a given bitcell may always be in one state (e.g., the bitcell can be configured in accordance with an embodiment of the present invention, but need not be actually switched). While the example embodiment shown has the selector element S positioned below the bidirectional memory element M with its electrode connected to a wordline, other embodiments may have the selector element S above the memory element M and/or with its electrode coupled to a bitline. As will be appreciated, bitcells with symmetrical electrodes have relatively symmetrical characteristics. Such symmetry may be adjusted, for example, by changing the electrode geometries and/or materials, if so desired. Likewise, should asymmetry be desired, then different materials and/or geometries can be used for the electrodes.

In some example configurations, one or more dimensions (e.g., thickness) of the electrode and insulator layers of the selector element S may be chosen or otherwise tuned such that the upper and lower electrode layers are sufficiently insulated from one another while still permitting electrons to pass from one electrode to the other electrode when turn on conditions are satisfied. In some specific instances, each of the electrode and insulator layers of the selector element S may have a thickness, for example, in the nanometer range (e.g., tens of angstroms), and in one specific example embodiment may be in the range of less than or equal to about 1-100 nm. In some other example embodiments, each of the electrode and insulator layers of the selector element S may have a thickness in the angstrom range (e.g., about 0.1-1 nm) and/or may be implemented as a monolayer. In some embodiments, the electrode and insulator layers of the selector element S may be implemented, for example, as a thin film deposited by any suitable deposition techniques (e.g., chemical vapor deposition, sputter deposition, physical vapor deposition, etc.). In still other example embodiments, each of the electrode and insulator layers of the selector element S may be implemented with multiple layers deposited by any suitable deposition technique, wherein the multiple layers may be the same material or different materials. Numerous other suitable materials, geometries, and/or configurations for the selector element S will be apparent in light of this disclosure, and the claimed invention is not intended to be limited to any particular material, geometry, and/or configuration.

As previously explained, the memory element M may be capable of assuming either a set or reset state (e.g., for storing a logical 1 or logical 0, respectively). While the memory element M may be configured with any number of memory element technologies as will be apparent in light of this disclosure, in some example embodiments of the present invention, the memory element M is implemented with a perpendicular MTJ element. FIGS. 5a through 6d illustrate example MTJ memory elements that can be used in accordance with some such embodiments, each of which will now be discussed in turn.

In a more general sense, and in accordance with some example embodiments, the memory element M can be configured with any bidirectional material stack configuration suitable for non-volatile memory data storage characterized by two states (e.g., logic 0 and logic 1). As will be appreciated, the memory element M may be programmed to one state by application of a voltage or current in one direction and to the other state by a current or voltage applied in the opposite direction. As will be further appreciated, the memory element M may be read by application of similar voltage or current signal, or one of lesser magnitude, for example, in the same direction as one of the write signals.

Altering the state of the memory element M to program it may be accomplished by applying voltage potentials to the corresponding wordline and bitline (or other suitable contacts), thereby generating a voltage potential across the memory material of the memory element M. In one specific example embodiment, a maximum voltage potential difference of less than 1.0 volt is applied across the memory element M by applying about 0 volts to the wordline and about 0.9 volts to the bitline. Such biasing can be provisioned, for instance, by the R/W control circuitry as discussed with reference to FIG. 1a. A current flowing through the memory element M in response to the applied voltage potentials may be used to read or alter the state of the memory element M. Other voltage schemes can be used as will be appreciated in light of this disclosure.

The information stored in the memory element M may be read, for example, by measuring the resistance of the memory element M, either directly or indirectly. As an example, a read current may be provided to the memory element M using the opposed lines word/bit lines, and a resulting read voltage across the memory element M may be compared against a reference voltage using, for example, a sense amplifier. If the read voltage is above a given threshold, then a logic 1 is presumed to be stored in the memory element M; if the read voltage is below the given threshold, then a logic 0 is presumed to be stored in the memory element M.

To select a given bitcell for a given read or write request, the selector element S for that selected bitcell can be triggered to provide access. When activated, the selector element S allows current to flow through the memory element M in a direction determined by the bias applied across the bitcell, thereby effecting the desired access operation (e.g., read, write 0, or write 1). For instance, a voltage below the threshold voltage $V_{TH}$ is applied across the selector element S, the selector element S is off and may exhibit relatively high resistance (e.g., 10 Kohms to 1 Mohm or higher, in some embodiments). Note that this condition occurs regardless of the direction of the current flow. As will appreciated, the selector element S operating parameters, such as OFF-state resistance, ON-state resistance, and threshold voltage $V_{TH}$ can be tailored to a given application by adjusting, for example, the composition or geometry of the selector element, or stacking the selector elements so as to benefit from serial coupling.

The selector element S generally remains in its OFF-state until its threshold voltage $V_{TH}$ is satisfied thereby causing the selector element S to switch or otherwise transition to a relatively low resistance conductive ON-state. As previously explained, the voltage across the selector element S configured with snapback after the turn-on condition is satisfied drops to a lower holding voltage $V_H$ and remains there so long as sufficient current $I_H$ is supplied to the selector element S. As previously explained, the snapback voltage $V_{Snapback}$ is the difference between the threshold voltage $V_{TH}$ and the holding voltage $V_H$, and the corresponding region of a current/voltage plot is referred to as the snapback region. As will be appreciated in light of this disclosure, selector elements configured in accordance with an embodiment of the present invention can be configured such that the snapback allows for the ON-state voltage of the selector to be accommodated by a given maximum supply voltage, wherein without the snapback, the ON-state voltage would exceed that maximum supply voltage.

Note that an access signal applied to a given bitcell need not instantaneously transform the cell voltage. For instance, in some example configurations, the access signal gradually charges the bitcell and the associated row and column lines, toward $V_{TH}$. As the voltage applied across the bitcell increases, the voltage across the selector element S eventually reaches the threshold voltage $V_{TH}$, at which point the selector element S turns on and transitions to a highly conductive state (e.g., <1 Kohm, depending on the composition and/or geometry of the upper/lower electrodes and/or insulator material). During the charging process, the proportion of bitcell voltage that drops across the selector element S can be determined by the voltage divider formed by the resistance of the selector element S in the OFF-state and the resistance of the memory element M, which will change as the applied voltage changes.

In operation, and as a general assumption, so long as the selector element S remains in the OFF-state, the majority (e.g., 90% or more in some embodiments) of the voltage applied across the bitcell fails across the selector element S, and only an insignificant portion (e.g., 10% or less in such embodiments) of the applied voltage drops across the memory element M. Once the selector element S turns on, the voltage across the selector element S remains substantially at the holding voltage $V_H$ and the remainder of the applied voltage ($V_{CELL}-V_H$) drops across the memory element M. As previously described, a minimal current $I_H$ can be maintained through the bitcell to sustain the ON-state and holding voltage $V_H$ of the selector element S.

Figure 5A:
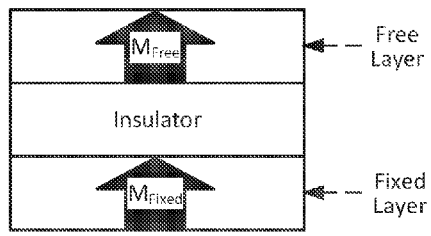
FIGS. 5a through 6d each illustrates a cross-section schematic view an example of memory element that can be used in a memory array configured in accordance with an embodiment of the present invention.
Figure 5B:
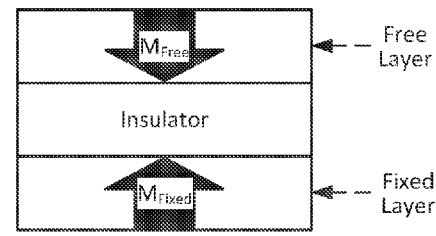

FIGS. 5a and 5b illustrate examples of memory elements that can be used in a memory array configured in accordance with an embodiment of the present invention. In more detail, FIG. 5a is a cross-section schematic view of an example perpendicular MTJ in its parallel (P) and state configured in accordance with an example embodiment of the present invention, and FIG. 5b is a cross-section schematic view of the perpendicular MTJ of FIG. 5a in its anti-parallel (AP) state. As can be seen and as previously explained, the perpendicular MTJ includes a first (fixed) ferromagnetic layer, an insulator layer, and a second (free) ferromagnetic layer. The fixed layer, sometimes referred to as being pinned, does not normally undergo changes in its magnetization ($M_{Fixed}$)—its direction of magnetization remains fixed and serves as a reference. On the other hand, the free layer, sometimes referred to as being dynamic, does undergo changes in the direction of its magnetization ($M_{Free}$).

In FIG. 5a, the fixed ferromagnetic and free ferromagnetic layers have magnetizations—$M_{Fixed}$ and $M_{Free}$, respectively—in the same direction (hence, perpendicular MTJ is in its P state). In the P state, electrons with spins oriented parallel to the magnetization (spin-up electrons) readily pass from the fixed ferromagnetic layer through the insulator layer to the free ferromagnetic layer, while electrons with spins oriented anti-parallel to the magnetization (spin-down electrons) are strongly scattered. The spin-up electrons can tunnel through the insulator layer because there is a sufficiently high quantity of unoccupied spin-up states available in the free ferromagnetic layer. As a result, the P-state MTJ has a low resistivity for electrons with spins oriented parallel to the magnetization and a high resistivity for electrons with spins oriented anti-parallel to the magnetization. Otherwise put, it is more likely that electrons will tunnel (a current will pass) through the insulator layer in the P state (low resistance state) of the perpendicular MTJ than in the AP state, as will now be discussed with reference to FIG. 5b.

In FIG. 5b, $M_{Fixed}$ and $M_{Free}$ are in opposing directions (hence, the perpendicular MTJ is in its AP state). In the AP state, electrons of both types of spins (spin-up and spin-down electrons) are strongly scattered. Quantum tunneling is suppressed in this instance because there are fewer spin-up states available (as compared to the P state previously discussed with reference to FIG. 5a). As a result, the AP-state MTJ has a high resistivity for electrons regardless of spin orientation. Otherwise put, it is less likely that electrons will tunnel (a current will pass) through the insulator layer in the AP state (high resistance state) of the perpendicular MTJ than in the P state.

Figure 6A:
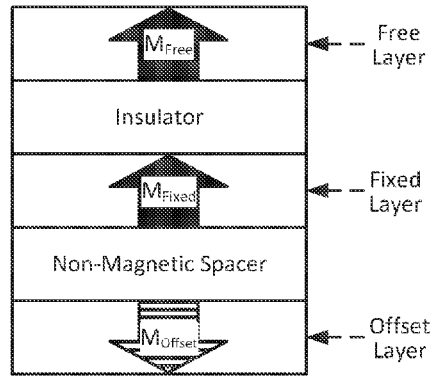
Figure 6B:
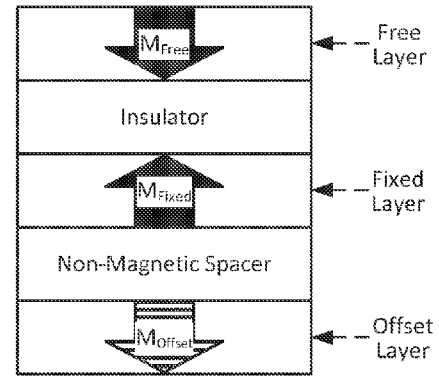

FIG. 6a is a cross-section schematic view of a perpendicular MTJ in its parallel (P) state, configured in accordance with another example embodiment of the present invention, and FIG. 6b is a cross-section schematic view of the perpendicular MTJ of FIG. 6a in its anti-parallel (AP) state. As can be seen in this example configuration, the MTJ element includes an insulator layer sandwiched between a fixed ferromagnetic layer and a free ferromagnetic layer. In addition, the MTJ device further includes a non-magnetic spacer sandwiched between an offset layer and the fixed ferromagnetic layer. The magnetization $M_{Offset}$ of the offset layer may be opposite that of the fixed ferromagnetic layer, in accordance with an embodiment of the present invention. In both the P state (FIG. 6a) and the AP state (FIG. 6b), the offset layer introduces an additional internal magnetic field (via its magnetization $M_{Offset}$) which, in some embodiments, shifts (e.g., better centers) R-H hysteresis, increases the energy of the P state and/or reduces the energy of the AP state (e.g., better equalizes the energy barrier between the P and AP states), and/or otherwise improves performance of the perpendicular MTJ element. Accordingly, the performance of the MTJ element may approach or otherwise approximate the idealized perpendicular MTJ performance, in some such embodiments. The magnitude of $M_{Offset}$ may be chosen, adjusted, or otherwise tuned as suitable for a given application, as will be apparent in light of this disclosure.

The offset layer may include, for example, one or more ferromagnetic materials such as, but not limited to, iron, cobalt, nickel, alloys thereof, transition metal-metalloid alloys (e.g., transition metal with a metalloid such as boron), and/or any other suitable ferromagnetic materials. In some example embodiments, the offset layer may have one or more dimensions (e.g., surface area; thickness) comparable to those of the fixed ferromagnetic layer and/or free ferromagnetic layer. In some example embodiments, the offset layer may have a thickness, for instance, in the nanometer range (e.g., tens of angstroms to several hundred nanometers), and in one specific example embodiment may be in the range of about 1-100 nm. In some other example embodiments, the offset layer may have a thickness in the angstrom range (e.g., about 0.1-1 nm) and/or may be implemented as a monolayer. In some example embodiments, the offset layer may be implemented, for instance, as a thin film deposited by any suitable deposition techniques (e.g., chemical vapor deposition, physical vapor deposition, sputter deposition, molecular beam epitaxy, or other suitable deposition process/means). In still other embodiments, the offset layer may be implemented with multiple material layers deposited by any suitable deposition, wherein the multiple layers may be the same material or different materials (ferromagnetic materials, or a combination of ferromagnetic materials and non ferromagnetic materials). In some embodiments, the offset layer may exhibit magnetic anisotropy such that its magnetization may be substantially orthogonal to its surface (e.g., the direction of magnetization $M_{Offset}$ is perpendicular to the plane of the offset layer). Numerous other suitable materials, geometries, and/or configurations for the offset layer will be apparent in light of this disclosure, and the claimed invention is not intended to be limited to any particular material, geometry, or configuration.

The fixed ferromagnetic layer and/or free ferromagnetic layer may be implemented, for example, as conventionally done and may include, for instance, any one or more of the same ferromagnetic materials discussed above with reference to the offset layer. In some embodiments, the fixed ferromagnetic layer and/or free ferromagnetic layer may have one or more dimensions (e.g., surface area; thickness) comparable to those of the offset layer. In some example embodiments, the fixed ferromagnetic layer and/or free ferromagnetic layer 240 may have a thickness, for example, in the nanometer range (e.g., tens of angstroms), and in one specific example embodiment may be in the range of less than or equal to about 1-100 nm. In some other example embodiments, the fixed ferromagnetic layer and/or free ferromagnetic layer may have a thickness in the angstrom range (e.g., about 0.1-1 nm) and/or may be implemented as a monolayer. As previously discussed with reference to the offset layer, the fixed ferromagnetic layer and/or free ferromagnetic layer may be implemented, for example, as a thin film deposited by any suitable deposition techniques as previously mentioned. In still other embodiments, the fixed ferromagnetic layer and/or free ferromagnetic layer may be implemented with multiple material layers deposited by any suitable deposition, wherein the multiple layers may be the same material or different materials (ferromagnetic materials, or a combination of ferromagnetic materials and non-ferromagnetic materials). In some embodiments, each of the fixed ferromagnetic layer and/or free ferromagnetic layer may exhibit magnetic anisotropy such that its magnetization may be substantially orthogonal to its surface (e.g., the direction of magnetization $M_{Fixed}$ and $M_{Free}$ is perpendicular to the plane of the fixed layer and free layer, respectively). Any number of other suitable materials, geometries, and/or configurations for the fixed ferromagnetic layer and/or free ferromagnetic layer will be apparent in light of this disclosure, and the claimed invention is not intended to be limited to any particular material, geometry, and/or configuration.

The insulator layer may be included between the fixed ferromagnetic layer and free ferromagnetic layer of the perpendicular MTJ, as conventionally done. The insulator layer may be, for example, any suitable dielectric or insulator material or materials (e.g., oxides, nitrides, etc.), and in some specific example embodiments is magnesium oxide, aluminum oxide, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, lead scandium tantalum oxide, and lead zinc niobate, and/or other media/material which is non-magnetic and permits sufficient quantum tunneling. The insulator layer may have one or more dimensions (e.g., surface area; thickness) comparable to those of the ferromagnetic and/or offset layers. In some example configurations, one or more dimensions (e.g., thickness) of the insulator layer may be chosen or otherwise tuned such that the fixed layer and free layer are sufficiently insulated from one another while still permitting electrons to pass from one of such ferromagnetic layers to the other via quantum tunneling through the insulator. In some specific instances, the insulator layer may have a thickness, for example, in the nanometer range (e.g., tens of angstroms), and in one specific example embodiment may be in the range of less than or equal to about 1-100 nm. In some other example embodiments, the insulator layer may have a thickness in the angstrom range (e.g., about 0.1-1 nm) and/or may be implemented as a monolayer. As similarly discussed with reference to the ferromagnetic and/or offset layers, in some embodiments, the insulator layer may be implemented, for example, as a thin film deposited by any suitable deposition techniques (e.g., chemical vapor deposition, sputter deposition, physical vapor deposition, etc.). In still other example embodiments, the insulator layer may be implemented with multiple layers deposited by any suitable deposition, wherein the multiple layers may be the same material or different materials (insulator materials, or a combination of insulator materials and non-insulator materials). Numerous other suitable materials, geometries, and/or configurations for the insulator layer of the memory element will be apparent in light of this disclosure, and the claimed invention is not intended to be limited to any particular material, geometry, and/or configuration.

The non-magnetic spacer layer may be included in the structure of the perpendicular MTJ. The non-magnetic spacer may be, for example, adjacent to or otherwise integrated with the offset layer. As shown in the example embodiments of FIGS. 6a-6b, the non-magnetic spacer can be provided between the offset layer and the fixed ferromagnetic layer. Alternatively, and as shown in the example embodiments of FIGS. 6c-6d, the non-magnetic spacer can be provided between the offset layer and the free ferromagnetic layer. In some specific example embodiments, the non-magnetic spacer may be, for instance, the same material as the insulator layer. In other embodiments, the non-magnetic spacer can be different from the insulator layer. In one specific example embodiment, for instance, the insulator layer is implemented with magnesium oxide and the non-magnetic spacer is implemented with ruthenium or any other suitable non-magnetic material or materials. The non-magnetic spacer may have one or more dimensions (e.g., surface area; thickness) comparable to those of the insulator layer and/or the ferromagnetic and/or offset layers. In some specific instances, the non-magnetic spacer layer may have a thickness, for example, in the nanometer range (e.g., tens of angstroms), and in one specific example embodiment may be in the range of less than or equal to about 1-100 nm. In some other example embodiments, the non-magnetic spacer layer may have a thickness in the angstrom range (e.g., about 0.1-1 nm) and/or may be implemented as a monolayer. As similarly discussed above with reference to the insulator layer and/or the ferromagnetic and/or offset layers, in some embodiments, the non-magnetic spacer layer may be implemented, for example, as a thin film deposited by any suitable deposition techniques (e.g., chemical vapor deposition, sputter deposition, physical vapor deposition, etc.). In still other example embodiments, the spacer layer may be implemented with multiple layers deposited by any suitable deposition, wherein the multiple layers may be the same material or different materials (insulator materials, or a combination of insulator materials and non-insulator materials). Numerous other suitable materials, geometries, and/or configurations for the non-magnetic spacer layer will be apparent in light of this disclosure, and the claimed invention is not intended to be limited to any particular material, geometry, and/or configuration.

Figure 6C:
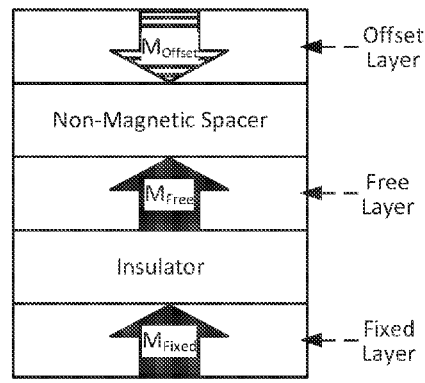
Figure 6D:
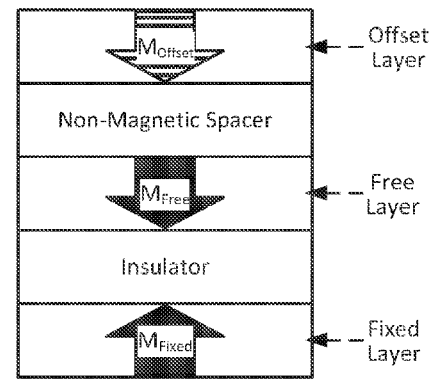

As will be appreciated in light of this disclosure, in some example embodiments, the additional magnetic field from the offset layer may affect (e.g., mitigate or eliminate) the intrinsic asymmetric energy barrier between the P and AP states of perpendicular the MTJ element. As will be appreciated, the relative proximity of ferromagnetic the offset layer to the fixed ferromagnetic layer (as shown in FIGS. 6a-6b) and/or the free ferromagnetic layer (as shown in FIGS. 6c-6d) may alter or tune the effect of $M_{Offset}$ on the AP/P energy barrier for the perpendicular MTJ. Thus, and in accordance with an embodiment of the present invention, one or more dimensions (e.g., thickness) of the non-magnetic spacer, may be modulated, thus changing/tuning the effective distance between the offset layer and the ferromagnetic layers of the perpendicular MTJ. Similarly, as will be appreciated, one or more dimensions (e.g., thickness) of the fixed ferromagnetic layer, free ferromagnetic layer, and/or offset layer may be modulated to alter/tune the effect of $M_{Offset}$ (e.g., increasing the thickness of a given ferromagnetic layer and/or offset layer may result in a greater effect from $M_{Offset}$). In some such cases, such dimension modulation may achieve various changes in the effect of $M_{Offset}$ and thus shift (e.g., better center) R-H hysteresis, increase the energy of the P state and/or reduce the energy of the AP state (e.g., better equalize the energy barrier between the P and AP states), and/or otherwise improve performance of the perpendicular MTJ element.

In some embodiments in which an offset layer is included in or otherwise proximate the fixed ferromagnetic layer, one or more of the dimensions of the non-magnetic spacer may be chosen such that the magnetization $M_{Fixed}$ of the fixed layer remains substantially unaltered (e.g., constant) in the presence of the magnetic field produced by the offset layer (e.g., the magnetization of the fixed layer is not prone to flipping due to the presence of $M_{Offset}$). In some cases, the fixed layer may be designed, in part or in whole, such that a given thickness (or range of thicknesses) of the non-magnetic spacer does not destabilize its magnetization (e.g., its magnetization is not prone to flipping due to $M_{Offset}$). In other embodiments in which an offset layer is included in or otherwise proximate the free ferromagnetic layer, one or more of the dimensions of the non-magnetic spacer may be chosen such that the magnetization $M_{Free}$ of the free layer may be altered (e.g., more readily flipped) in the presence of the magnetic field produced by the offset layer (e.g., the magnetization of the free layer is prone or otherwise permitted to flip due to the presence of $M_{Offset}$). In some cases, the free layer may be designed, in part or in whole, such that a given thickness (or range of thicknesses) of the non-magnetic spacer sufficiently (e.g., suitably for a given application) destabilizes its magnetization (e.g., its magnetization is more prone to flipping due to $M_{Offset}$).

Modulating the thickness, for example, of the non-magnetic spacer may allow, in some embodiments, for more easily changing the direction of the magnetization of the free layer. As will be appreciated, adjustment/tuning of the thickness of the non-magnetic spacer may allow for one or more of the following types of interaction between the offset layer and the free ferromagnetic layer: (1) ferromagnetic (e.g., $M_{Free}$ and $M_{Offset}$ have the same alignment and there is a net magnetic moment in the absence of an external magnetic field); (2) anti-ferromagnetic (e.g., $M_{Free}$ and $M_{Offset}$ have opposite alignments and there is zero net magnetization in the absence of an external magnetic field); and/or (3) zero coupling. In some specific example embodiments in which zero coupling is desired, the non-magnetic spacer may have at least one dimension (e.g., thickness) in the range of about 1-10 Å (e.g., less than or equal to about 8 Å). Other thicknesses/dimensions of the non-magnetic spacer suitable for achieving zero coupling (and/or other type of interaction or desired performance) with the free layer will be apparent in light of this disclosure, and the claimed invention is not intended to be limited to any particular such geometry.

Any of the various layers of a given perpendicular the MTJ element (e.g., fixed layer, insulator layer, free layer, spacer layer, and/or offset layer) may be formed/deposited by any suitable techniques, including, but not limited to, chemical vapor deposition, physical vapor deposition, magnetron sputter deposition, molecular beam epitaxy, etc. In some embodiments, formation/preparation of perpendicular the MTJ may include, in part or in whole, one or more photolithography techniques. Other suitable formation techniques will be apparent in light of this disclosure, and the claimed invention is not intended to be limited to any particular formation technique.

Figure 7:
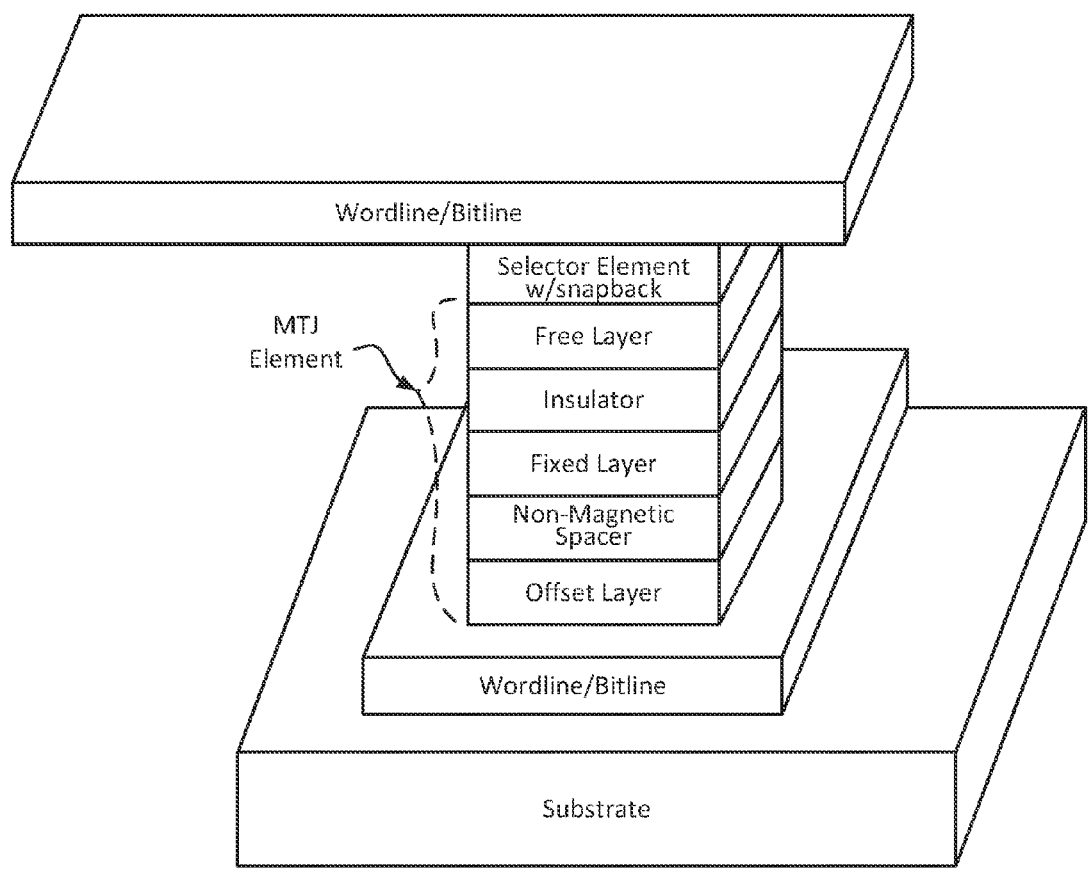
FIG. 7 is a partial perspective view of an example integrated circuit implementing an embedded memory configured in accordance with an embodiment of the present invention.

FIG. 7 is a partial perspective view of an example integrated circuit implementing an embedded memory configured in accordance with an embodiment of the present invention. As can be seen, the memory includes a bitcell structure that includes a selector configured with snapback serially connected with a memory element configured with a perpendicular MTJ element. The selector-memory of the stack is sandwiched between the intersection of a bitline and wordline.

The selector configured with snapback can be configured as previously described herein. As also previously discussed, this example perpendicular MTJ may be in a P state or an AP state, and includes an additional ferromagnetic layer (offset layer) proximate the fixed layer and a non-magnetic spacer therebetween, as discussed with reference to FIGS. 6a-d. However, the claimed invention is not intended to be limited to only the depicted example; any suitable MTJ configuration can be used. For instance, the MTJ element may be configured as discussed with reference to FIGS. 5a-b, in accordance with another embodiment.

In accordance with some example embodiments, the substrate may be, for example, a semiconductor wafer or other suitable substrate. In some such embodiments, the substrate may be, for example, a metal, silicon, germanium, III-V materials, oxide, nitride, or combinations thereof. In some embodiments, the substrate may be configured, for example, as a bulk substrate, a semiconductor-on-insulator (XOI, where X is a semiconductor material such as silicon, germanium, or germanium-enriched silicon), or a multi-layered structure. Numerous other suitable materials and configurations for the substrate will depend on a given application as well as factors such as cost and desired semiconductor processes, as will be apparent in light.

As previously explained, the memory and selector elements of this example are serially connected between the intersection of a wordline and a bitline, which are generally used to provide a conduction path to and from the bitcell, depending on the bias scheme applied and ensuing current flow direction, as will be appreciated. Note that while this embodiment shows the selector on top and the memory element on the bottom, a reverse configuration may be used as well, given the serial nature of the arrangement. As will be further appreciated, while word/bit line terminology is used to describe this example embodiment, any suitable connection scheme can be used in biasing the bitcell, including any number of electrodes or electrical contacts, whether those word/bit lines or contacts be dedicated to a particular bitcell or shared by multiple bitcells. In other embodiments, for instance, a single memory element serially connected with a selector having snapback may be sandwiched between two electrical contacts. In such cases the device could be used as a low-voltage switch, for instance.

In any such cases, the wordlines, bitlines, conductive line/run, metallized via, and/or other conductor for providing bias across the bitcell may comprise a conductive metal such as, but not limited to, copper, aluminum, silver, nickel, gold, titanium, indium, tungsten, alloys thereof, or other suitably conductive metal, in accordance with some such embodiments.

Example System

Figure 8:
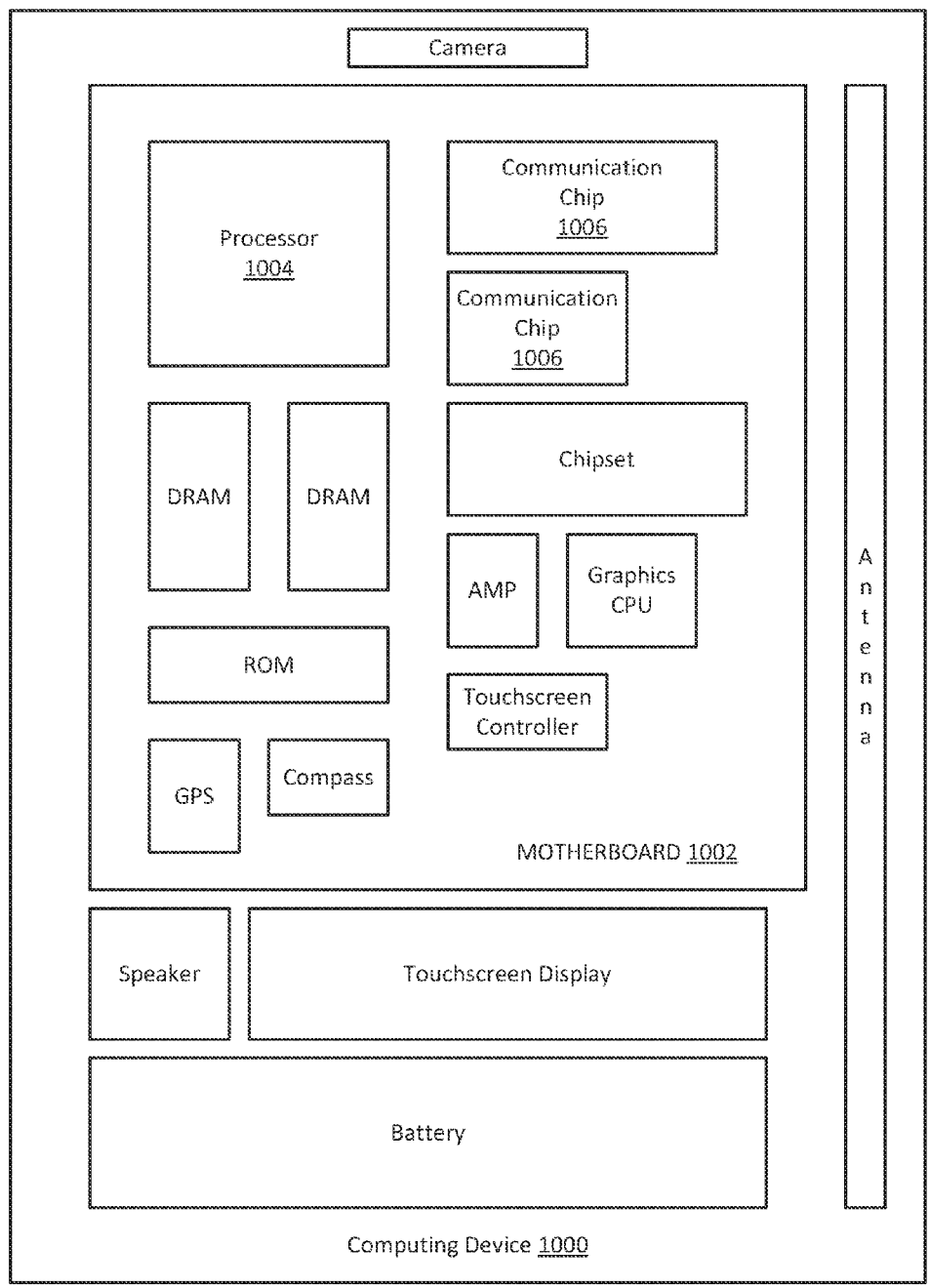
FIG. 8 illustrates a computing system implemented with one or more embedded bidirectional memory structures configured in accordance with an embodiment of the present invention.

FIG. 8 illustrates a computing system implemented with one or more embedded memory structures configured in accordance with an embodiment of the present invention. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures configured with a low voltage embedded memory configured as described herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as (IFS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor 1004 includes a low voltage embedded memory configured as described herein. The tem "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes a low voltage embedded memory configured as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that employs low voltage embedded memory configured as described herein. As will be appreciated in light of this disclosure, various embodiments of the present invention can be used to improve performance on products fabricated at any process node (e.g., in the micron range, or sub-micron and beyond) by allowing for a low voltage embedded memory.

Numerous embodiments will be apparent, and features described herein can be combined in any number of configurations. One example embodiment of the present invention provides an integrated circuit. The integrated circuit includes a first conductor and a second conductor, and a bitcell sandwiched between the first and second conductors and for storing a bit. The bitcell comprises a selector element serially connected with a memory element. The selector element has a threshold voltage $V_{TH}$, an ON-state voltage, and a snapback voltage $V_{Snapback}$, such that the selector element transitions from an OFF state to an ON-state when a voltage potential across the selector element exceeds $V_{TH}$, and the selector element snaps back to a hold voltage $V_H$ while maintaining the ON-State. Without the snapback voltage $V_{Snapback}$, the ON-state voltage would exceed a maximum voltage potential that can be applied across the first and second conductors. In some cases, the maximum voltage potential that can be applied across the first and second conductors is applied during a write to the bitcell. In some cases, the maximum voltage potential that can be applied across the first and second conductors is less than 1 volt. In some cases, the first conductor is a wordline and the second conductor is a bitline, in some cases, the selector element comprises an insulator layer sandwiched between two electrodes. In one such case, the insulator layer comprises a crystalline material. In some cases, the memory element comprises an insulator layer sandwiched between two electrodes. In some cases, the memory element comprises a magnetic tunnel junction (MTJ) element. In one such case, the MTJ element comprises an insulator layer sandwiched between two ferromagnetic layers, with one of the ferromagnetic layers having a fixed magnetization direction and the other ferromagnetic layer having a changeable magnetization direction. In one such case, the MTJ element further comprises a non-magnetic spacer layer sandwiched between one of the ferromagnetic layers and an offset layer, and the offset layer has a magnetization direction that is opposite fixed magnetization direction. In some cases, the selector element transitions from the ON-state to the OFF-state when the voltage potential across the selector element drops below $V_{TH}$. Numerous variations will be apparent in light of this disclosure. For instance, another embodiment provides a semiconductor device having an embedded memory as variously defined in this paragraph. Another embodiment provides an electronic system comprising one or more of semiconductor devices variously defined in this paragraph.

Another embodiment of the present invention provides a semiconductor device having an embedded memory. The device includes a first conductor, a second conductor, and a bitcell sandwiched between the first and second conductors and for storing a bit. The bitcell comprising a selector element serially connected with a memory element. The selector element has a threshold voltage $V_{TH}$, an ON-state voltage, and a snapback voltage $V_{Snapback}$, such that the selector element transitions from an OFF-state to an ON-state when a voltage potential across the selector element exceeds $V_{TH}$, and the selector element snaps back to a hold voltage $V_H$ while maintaining the ON-State. Without the snapback voltage $V_{Snapback}$, the ON-state voltage would exceed a maximum voltage potential that can be applied across the first and second conductors, and the maximum voltage potential is less than 1 volt. In some cases, the maximum voltage potential that can be applied across the first and second conductors is applied during a write to the bitcell. In some cases, the selector element comprises an insulator layer sandwiched between two electrodes, and the insulator layer comprises a crystalline material. In some cases, the memory element comprises an insulator layer sandwiched between two ferromagnetic layers, with one of the ferromagnetic layers having a fixed magnetization direction and the other ferromagnetic layer having a changeable magnetization direction. In one such case, the memory element further comprises a non-magnetic spacer layer sandwiched between one of the ferromagnetic layers and an offset layer, and the offset layer has a magnetization direction that is opposite fixed magnetization direction. In some example cases, the selector element transitions from the ON-state to the OFF-state when the voltage potential across the selector element drops below $V_H$.

Another embodiment of the present invention provides a method for fabricating a semiconductor device. The method includes providing a first conductor, providing a second conductor, and providing a bitcell sandwiched between the first and second conductors and for storing a bit. The bitcell includes a selector element serially connected with a memory element. The selector element has a threshold voltage $V_{TH}$, an ON-state voltage, and a snapback voltage $V_{Snapback}$, such that the selector element transitions from an OFF-state to an ON-state when a voltage potential across the selector element exceeds $V_{TH}$, and the selector element snaps back to a hold voltage $V_H$ while maintaining the ON-State. In some such cases, without the snapback voltage $V_{Snapback}$, the ON-state voltage would exceed a maximum voltage potential that can be applied across the first and second conductors.

Another embodiment of the present invention provides an integrated circuit. The circuit includes a first conductor, a second conductor, and a bitcell sandwiched between the first and second conductors and for storing a bit, the bitcell comprising a selector element serially connected with a memory element. The selector element comprises an insulator layer sandwiched between two electrodes, and the insulator layer comprises a crystalline material. In some cases, the selector element has a threshold voltage $V_{TH}$ and an ON-state voltage, and the crystalline material exhibits an S-shaped IV curve with snapback, such that the selector element transitions from an OFF-state to an ON-state when a voltage potential across the selector element exceeds $V_{TH}$, and the selector element snaps back to a hold voltage $V_H$ while maintaining the ON-State. In some cases, the crystalline material comprises at least one of vanadium oxide, manganese oxide, titanium oxide, iron oxide, niobium oxide, and/or tantalum oxide. In some cases, the crystalline material comprises a compound having the chemical formula $R_{(1-x)}A_xBO_3$, where R is a rare-earth atom, A is a bivalent atom, and B may be selected from manganese, nickel, cobalt, titanium, or vanadium. In some cases, the crystalline material comprises at least one of chromium sulphide and/or iron sulphide.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. An integrated circuit comprising:
a first conductor;
a second conductor; and
a bitcell sandwiched between the first and second conductors and for storing a bit, the bitcell comprising a selector element serially connected with a memory element, wherein the selector element has a threshold voltage $V_{TH}$, an ON-state voltage, and a snapback voltage $V_{Snapback}$, the selector element configured to transition from an OFF-state to an ON-state in response to a voltage potential across the selector element exceeding $V_{TH}$, and the selector element further configured to snap back to a hold voltage $V_H$ in response to transitioning to the ON-State, wherein $V_H$ is less than $V_{TH}$ and $V_{Snapback}$ is $V_{TH}-V_H$;
wherein the memory element comprises a magnetic tunnel junction (MTJ) element.

2. The integrated circuit of claim 1 wherein the selector element is further configured to prevent the ON-state voltage from exceeding a maximum voltage potential across the first and second conductors, and wherein the maximum voltage potential applied across the first and second conductors is applied during a write to the bitcell.

3. A semiconductor device having the integrated circuit as defined in claim 2, wherein the maximum voltage potential is less than 1 volt.

4. The device of claim 3 wherein the maximum voltage potential applied across the first and second conductors is applied during a write to the bitcell.

5. The device of claim 3 wherein the selector element comprises an insulator layer sandwiched between two electrodes, and the insulator layer comprises a crystalline material.

6. The device of claim 3 wherein the memory element comprises an insulator layer sandwiched between two ferromagnetic layers, with one of the ferromagnetic layers having a fixed magnetization direction and the other ferromagnetic layer having a changeable magnetization direction.

7. The device of claim 6 wherein the memory element further comprises a non-magnetic spacer layer sandwiched between one of the ferromagnetic layers and an offset layer, and the offset layer has a magnetization direction that is opposite fixed magnetization direction.

8. The device of claim 3 wherein the selector element is configured to transition from the ON-state to the OFF-state when the voltage potential across the selector element drops below $V_H$.

9. The integrated circuit of claim 1 wherein the maximum voltage potential that can be applied across the first and second conductors is less than 1 volt.

10. The integrated circuit of claim 1 wherein the first conductor is a wordline and the second conductor is a bitline.

11. The integrated circuit of claim 1 wherein the selector element comprises an insulator layer sandwiched between two electrodes.

12. The integrated circuit of claim 11 wherein the insulator layer comprises a crystalline material.

13. The integrated circuit of claim 1 wherein the memory element comprises an insulator layer sandwiched between two electrodes.

14. The integrated circuit of claim 1 wherein the MTJ element comprises an insulator layer sandwiched between two ferromagnetic layers, with one of the ferromagnetic layers having a fixed magnetization direction and the other ferromagnetic layer having a changeable magnetization direction.

15. The integrated circuit of claim 14 wherein the MTJ element further comprises a non-magnetic spacer layer sandwiched between one of the ferromagnetic layers and an offset layer, and the offset layer has a magnetization direction that is opposite fixed magnetization direction.

16. The integrated circuit of claim 1 wherein the selector element is configured to transition from the ON-state to the OFF-state when the voltage potential across the selector element drops below $V_H$.

17. A semiconductor device having the integrated circuit as defined in claim 1.

18. An electronic system comprising the integrated circuit as defined in claim 1.

19. The integrated circuit of claim 1 wherein the crystalline material comprises at least one of: $VO_2$; MnO; $Ti_2O_3$; $Fe_2O_3$; $NbO_2$; $TaO_2$; a perovskite structure having the chemical formula $R_{(1-x)}A_xBO_3$, where R is a rare-earth atom, A is a bivalent atom, B is selected from manganese, nickel, cobalt, titanium, or vanadium; CrS; and FeS.

20. A method for fabricating a semiconductor device, the method comprising:
providing a first conductor;
providing a second conductor; and
providing a bitcell sandwiched between the first and second conductors and for storing a bit, the bitcell comprising a selector element serially connected with a memory element, wherein the selector element has a threshold voltage $V_{TH}$, an ON-state voltage, and a snapback voltage $V_{Snapback}$, the selector element configured to transition from an OFF-state to an ON-state in response to a voltage potential across the selector element exceeding $V_{TH}$, and the selector element further configured to snap back to a hold voltage $V_H$ in response to transitioning to the ON-State, wherein $V_H$ is less than $V_{TH}$ and $V_{Snapback}$ is $V_{TH}-V_H$;
wherein the memory element comprises a magnetic tunnel junction (MTJ) element.

21. An integrated circuit comprising:
a first conductor;
a second conductor; and
a bitcell sandwiched between the first and second conductors and for storing a bit, the bitcell comprising a selector element serially connected with a memory element;
wherein the selector element comprises an insulator layer sandwiched between two electrodes, and the insulator layer comprises a crystalline material,
wherein the selector element has a threshold voltage $V_{TH}$ and an ON-state voltage, and the crystalline material exhibits an S-shaped IV curve with snapback, the selector element configured to transition from an OFF-state to an ON-state in response to a voltage potential across the selector element exceeding $V_{TH}$, and the selector element further configured to snap back to a hold voltage $V_H$ in response to transitioning to the ON-State, wherein $V_H$ is less than $V_{TH}$ and $V_{Snapback}$ is $V_{TH}-V_H$; and
wherein the crystalline material comprises at least one of: $VO_2$; MnO; $Ti_2O_3$; $Fe_2O_3$; $NbO_2$; $TaO_2$; a perovskite structure having the chemical formula $R_{(1-x)}A_xBO_3$, where R is a rare-earth atom, A is a bivalent atom, B is selected from manganese, nickel, cobalt, titanium, or vanadium; CrS; and FeS.

* * * * *